(12) United States Patent
Chen et al.

(10) Patent No.: US 7,871,745 B2
(45) Date of Patent: Jan. 18, 2011

(54) EXPOSURE METHOD

(75) Inventors: Ju-Te Chen, Tainan (TW); Wen-Tsung Wu, Kaohsiung County (TW)

(73) Assignee: United Microelectronics Corp., Hsinchu (TW)

( * ) Notice: Subject to any disclaimer, the term of this patent is extended or adjusted under 35 U.S.C. 154(b) by 501 days.

(21) Appl. No.: 11/965,614

(22) Filed: Dec. 27, 2007

(65) Prior Publication Data
US 2009/0170039 A1    Jul. 2, 2009

(51) Int. Cl.
*G03F 9/00*    (2006.01)
*G03C 5/00*    (2006.01)

(52) U.S. Cl. .............................. 430/22; 430/30; 382/145
(58) Field of Classification Search .................... 430/22, 430/30; 382/145
See application file for complete search history.

(56) References Cited

U.S. PATENT DOCUMENTS

| | | | |
|---|---|---|---|
| 6,873,938 B1 | 3/2005 | Paxton et al. | |
| 7,006,195 B2 | 2/2006 | Raebiger et al. | |
| 7,127,317 B2 * | 10/2006 | Chiu et al. | 700/110 |
| 2006/0192943 A1 | 8/2006 | Roberts et al. | |

FOREIGN PATENT DOCUMENTS

| CN | 2004101020954 A | 7/2005 |
|---|---|---|
| CN | 2004100027138 A | 8/2005 |

* cited by examiner

*Primary Examiner*—Christopher G Young
(74) *Attorney, Agent, or Firm*—WPAT, PC; Justin King

(57) ABSTRACT

The invention provides an exposure method for manufacturing a device. The method includes providing a wafer having several exposure regions with a photoresist layer covering thereon. A feedback parameter map with several exposure-region feedback parameter sets respectively corresponds to the exposure regions of the wafer. At least one of the exposure-region feedback parameter sets is different from the rest of the exposure-region feedback parameter sets. According to the feedback parameter map, an exposure process is sequentially performed on each of the exposure regions of the wafer through an exposure tool to pattern the photoresist layer on the wafer. While the exposure tool performs the exposure process on each of the exposure regions, an exposure process parameter set of the exposure tool is adjusted based on the exposure-region feedback parameter sets corresponding to the exposure region in the feedback parameter map.

11 Claims, 3 Drawing Sheets

EXPOSURE METHOD

BACKGROUND OF THE INVENTION

1. Field of the Invention

The present invention relates to an exposure method, and in particular, to an exposure method for increasing uniformity of a critical dimension on a shot-to-shot level on the same wafer in a wafer acceptable test (WAT) step.

2. Description of Related Art

In a manufacturing process of an integrated circuit, a photolithography process is used to transfer customized circuit patterns on a photo mask to thin films formed on a wafer. An image transferring process includes forming a photoresist layer on a non-process layer. Then, the photoresist layer is illuminated through a photo mask having the customized circuit patterns. After that, a developing process is performed on the photoresist layer. Thereafter, an etching process is performed on the non-process layer by using a patterned photoresist layer as a mask. Hence, the image transferring process is accomplished.

Generally, one of basic parameters affecting a critical dimension (CD) in the photolithography process is mainly an exposure dose. Traditionally, CD control in the photolithography process includes compensating the exposure dose according to the measured CD after an exposure process is performed and providing a predetermined exposure dose by an energy set-up system, so that the CD of the wafers in a next lot can be closer to a target value. The exposure dose can be measured by measuring a photoresist pattern on the wafer manufactured by the apparatus, and an automatic feedback process is performed on the exposure apparatus according to/based on a result of measurement. The exposure apparatus is operated under good control of the parameters by using an advanced process control (APC), for example.

Product variations among the same products manufactured through different tool paths can be eliminated by using an automatic feedback system of the APC when the same products are manufactured massively through a plurality of the tool paths formed by arranging a plurality of manufacturing apparatuses, thereby increasing uniformity of product quality on a wafer-to-wafer level. Because of apparatus designs and wafer positions, pattern transformation among every exposure region on the same wafer has some little variations in a yellow light manufacturing process. As a device is increasingly miniaturized, variations of the CDs among different exposure regions on the same wafer affect an electrical property of a subsequently manufactured product significantly. However, the conventional automatic feedback system only provides a fixed feedback value for every wafer in every lot, which is not helpful in controlling the variations of the CDs among every exposure region on the wafer.

SUMMARY OF THE INVENTION

The present invention is directed to an exposure method which can increase uniformity of a critical dimension (CD) on a shot-to-shot level.

The present invention provides an exposure method capable of improving the overlay alignment of successive material layers in each exposure region.

The present invention provides an exposure method for manufacturing a device to improve an overlay alignment of successive layers in the device. The exposure method comprises steps as follows. First, a wafer is provided. The wafer is covered by a photoresist layer, and the wafer is divided into a plurality of exposure regions. Next, a feedback parameter map is provided. The feedback parameter map has a plurality of exposure-region feedback parameter sets respectively corresponding to the exposure regions of the wafer. At least one of the exposure-region feedback parameter sets is different from the rest of the exposure-region feedback parameter sets. After that, an exposure process is sequentially performed on each of the exposure regions on the wafer through an exposure tool to pattern the photoresist layer on the wafer according to the feedback parameter map. An exposure process parameter set of the exposure tool is adjusted based on the exposure-region feedback parameter set corresponding to each of the exposure regions in the feedback parameter map while the exposure tool performs the exposure process on each of the exposure regions.

According to an embodiment of the present invention, the feedback parameter map is obtained by steps as follows. A plurality of pilot-run wafers is provided at first. Then, a pilot-run process of the device is performed on each of the pilot-run wafers. Next, a wafer acceptable test (WAT) is performed on each of the pilot-run wafers undergone the pilot-run process, so as to generate a testing information corresponding to each of the pilot-run wafers. Finally, the testing information is collected and analyzed to obtain the feedback parameter map corresponding to manufacturing the device. Here, the step of collecting and analyzing the testing information further comprises collecting the testing information to create a device testing trend diagram. After that, an after-etching critical dimension information and an after-develop critical dimension information corresponding to the exposure process are provided. Finally, the device testing trend diagram is correlated with the after-etching critical dimension information and the after-develop critical dimension information respectively to obtain the feedback parameter map. The device testing trend diagram includes a device threshold current trend diagram and a device leakage current trend diagram.

According to an embodiment of the present invention, the step for performing the exposure process on each of the exposure regions by using the exposure tool further comprises adjusting the exposure process parameter set of the exposure tool according to a wafer feedback parameter set fed back from an advance process control (APC).

According to an embodiment of the present invention, the exposure process parameter set comprises an exposure dose, a light incident angle, an exposure focus and an overlay offset parameter set.

The present invention further provides an exposure method for manufacturing a device through a first tool path to improve an overlay alignment of successive layers in the device. The exposure method comprises steps as follows. A wafer is provided, wherein the wafer is covered by a photoresist layer, and the wafer is divided into a plurality of exposure regions. A first feedback parameter map is obtained from a database according to the first tool path, wherein the first feedback parameter map has a plurality of exposure-region feedback parameter sets respectively corresponding to the exposure regions of the wafer, and at least one of the exposure-region feedback parameter sets is different from the rest of the exposure-region feedback parameter sets. After that, according to the first feedback parameter map, an exposure process is sequentially performed on each of the exposure regions on the wafer through an exposure tool to pattern the photoresist layer. An exposure process parameter set of the exposure tool is adjusted based on the exposure-region feedback parameter set corresponding to each of the exposure regions in the feedback parameter map while the exposure tool performs the exposure process on each of the exposure regions.

According to an embodiment of the present invention, the database includes a plurality of data sheets, each of the data sheets is corresponding to a device manufacturing process, and each of the data sheets stores a plurality of tool paths corresponding to the device manufacturing process and a plurality of feedback parameter maps respectively corresponding to the tool paths. Each of the feedback parameter maps is obtained by steps as follows. A plurality of pilot-run wafers is provided at first. Then, a pilot-run process is performed on each of the pilot-run wafers. Next, a WAT is performed on each of the pilot-run wafers undergone the pilot-run process, so as to generate a testing information corresponding to each of the pilot-run wafers. Finally, the testing information is collected and analyzed to obtain the feedback parameter map corresponding to manufacturing the device. Here, the step of collecting and analyzing the testing information includes collecting the testing information to create a device testing trend diagram. After that, an after-etching critical dimension information and an after-develop critical dimension information corresponding to the exposure process are provided. Finally, the device testing trend diagram is correlated with the after-etching critical dimension information and the after-develop critical dimension information respectively for obtaining the feedback parameter map. The device testing trend diagram includes a device threshold current trend diagram and a device leakage current trend diagram.

According to an embodiment of the present invention, the step for performing the exposure process on each of the exposure regions by using the exposure tool further comprises adjusting the exposure process parameter set of the exposure tool according to a wafer feedback parameter set fed back from an advance process control (APC).

According to an embodiment of the present invention, wherein the exposure process parameter set includes an exposure dose, a light incident angle, an exposure focus and an overlay offset parameter set.

In the process for forming the device on the wafer, while the exposure process is performed on each of the exposure regions on the wafer, the exposure process parameter set of the exposure tool is adjusted according to exposure-region feedback parameter sets, which are corresponding to the exposure regions respectively, in the feedback parameter map, which is corresponding to the tool path to be used and the device to be formed, and thereby the shot-by-shot exposure parameter feedback adjustment is performed in each of the exposure regions on a single wafer according to the exposure-region feedback parameter set corresponding to the exposure region. Therefore, the uniformity of the critical dimension on the shot-to-shot level in the single wafer is improved and the overlay alignment between the successive material layers in each exposure region is improved as well.

In order to the make the aforementioned and other objects, features and advantages of the present invention comprehensible, several embodiments accompanied with figures are described in detail below.

DESCRIPTION OF EMBODIMENTS

Figure 1:
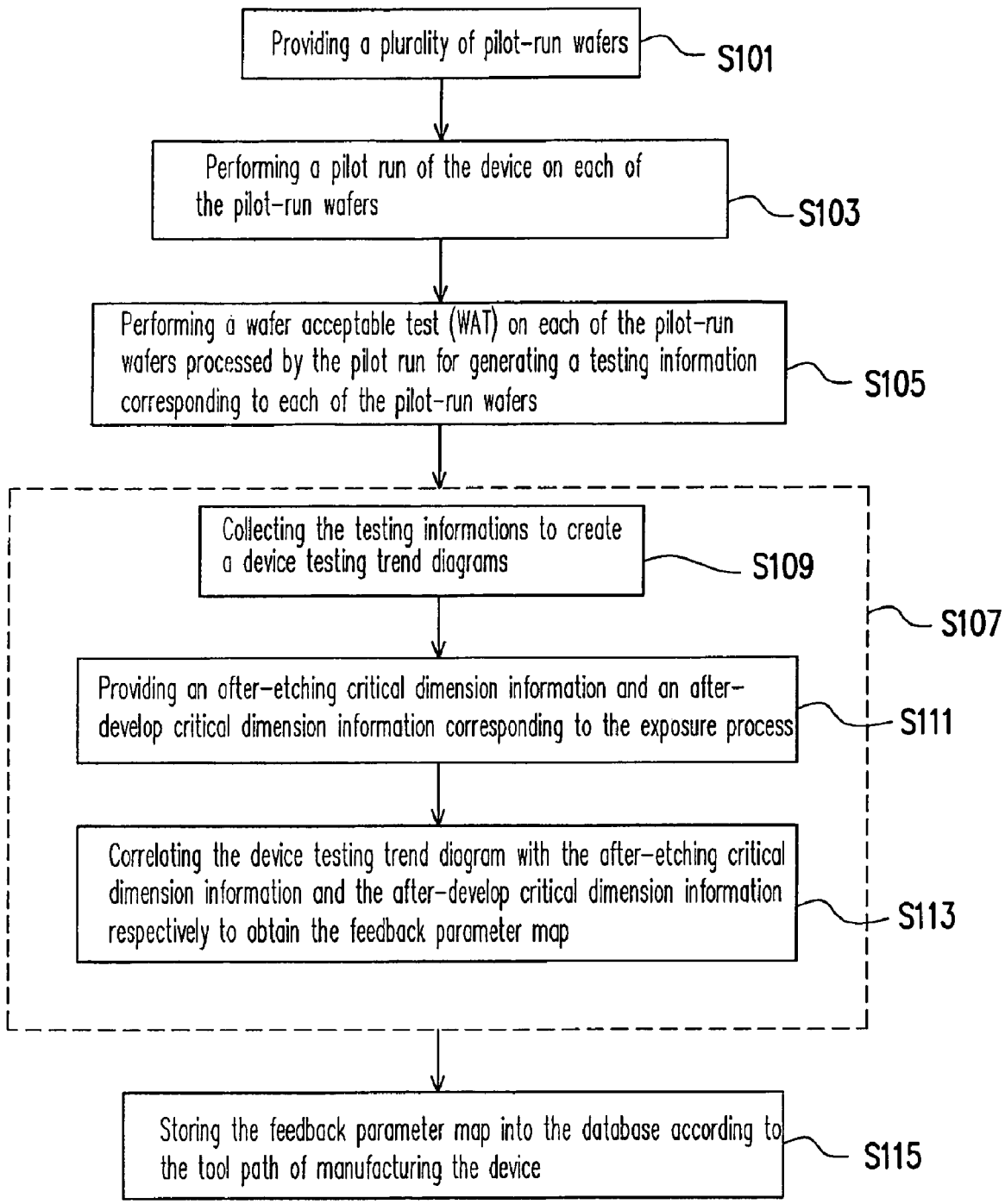
FIG. 1 illustrates a processing flow of forming a feedback parameter map according to the present invention.

FIG. 1 illustrates a processing flow of forming a feedback parameter map according to the present invention. Referring to FIG. 1, a plurality of pilot-run wafers is provided in step S101. A quantity of the pilot-run wafers can be that of wafers in a lot, such as 25 pieces. After that, a pilot-run process for manufacturing a device is performed on each of the pilot-run wafers through a tool path in step S103. The device can be as small as a simple circuit device or as big as a product having a complicated circuit layout. Furthermore, the tool path is a path in which various machines required to be used in the processing flow for manufacturing the device are arranged in order according to the operating sequence of manufacturing the aforesaid device. Thereafter, in step S105, a wafer acceptable test (WAT) is performed on each of the pilot-run wafers undergone the pilot-run process to generate various testing information. Each testing information is corresponding to one of the pilot-run wafers. Test items of the WAT include a threshold voltage of every device on every pilot-run wafer, a distribution trend of N-type ions, and a distribution trend of P-type ions.

Thereafter, in step S107, the testing information obtained from the WAT is collected and analyzed to obtain a feedback parameter map corresponding to the tool path for manufacturing the devices. In one embodiment, in step S107, the step of collecting and analyzing the testing information further includes the step S109, in which the testing information is collected to create a device testing trend diagram of a single wafer. The device testing trend diagram of the single wafer includes a device threshold current trend diagram and a device leakage current trend diagram of all devices. In one embodiment, the aforesaid device testing trend diagram includes an N-type ion distribution diagram or a P-type ion distribution diagram of all devices on the single wafer.

Afterwards, in step S111 of the step S107, an after-etching critical dimension information and an after-develop critical dimension information corresponding to the exposure process required for manufacturing the devices are provided. In other words, a critical dimension trend diagram corresponding to the device after an etching process performed thereon and a critical dimension trend diagram corresponding to the patterned photoresist layer for forming the device after a developing process performed thereon are provided. Finally, in step S113, the device testing trend diagram is correlated with the after-etching critical dimension information and the after-develop critical dimension information respectively to obtain the feedback parameter map. In one embodiment, the device testing trend diagram, such as the device threshold current trend diagram, the device leakage current trend diagram, and the N-type ion distribution diagram of all devices on the wafer and the P-type ion distribution diagram of all the devices on the wafer, obtained from the WAT is correlated with a critical dimension of polysilicon in all devices on the wafer. Therefore, the device testing trend diagram obtained from the WAT is correlated with a critical dimension trend diagram of several polysilicon-containing devices formed from etching a polysilicon layer on the wafer and is correlated with a critical dimension trend diagram of a patterned photoresist layer formed from developing a photoresist layer on the polysilicon layer of the wafer. By correlating a WAT trend diagram and the critical dimension trend diagram corresponding to the device, exposure parameter feedback adjustment required to be made by an exposure tool in an exposure process performed in each of the exposure regions on the wafer can be obtained when the exposure process is performed on the wafer, and the feedback parameters of all of the exposure regions on the wafer are collected to form a feedback parameter map.

In other words, the feedback parameter map has a plurality of exposure-region feedback parameter sets. The exposure-region feedback parameter sets are corresponding to the exposure regions on the wafer respectively. At least one of the exposure-region feedback parameter sets is different from the rest of the exposure-region feedback parameter sets. Therefore, when the same device is manufactured through the same tool path in the future, the exposure tool can adjust the exposure parameters sequentially according to the exposure-region feedback parameter set when the exposure process is performed sequentially in each of the exposure regions on the wafer, so as to minimize differences in the manufacturing processes among the exposure regions, and to increase uniformity and unity of the critical dimensions among the exposure regions and the overlay alignment between the successive material layers in each exposure region is improved as well. In other words, in the process for patterning the photoresist layer on the wafer, while the exposure process is performed on each exposure region, the exposure parameter of the exposure tool, such as an exposure dose, a light incident angle, an exposure focus and an overlay offset parameter set of the successive material layers in each exposure region, is adjusted according to a shot-by-shot exposure parameter feedback adjustment by referring to the exposure-region feedback parameter sets in the feedback parameter map.

After the feedback parameter map corresponding to the device manufacturing process and the tool path is obtained in step S107, the feedback parameter map is stored in a database in step S115. In one embodiment, a plurality of the feedback parameter maps is stored in the database and the stored feedback parameter maps are classified according to different devices. However, as regards a single device, the stored feedback parameter maps are classified according to the tool paths.

Figure 2:
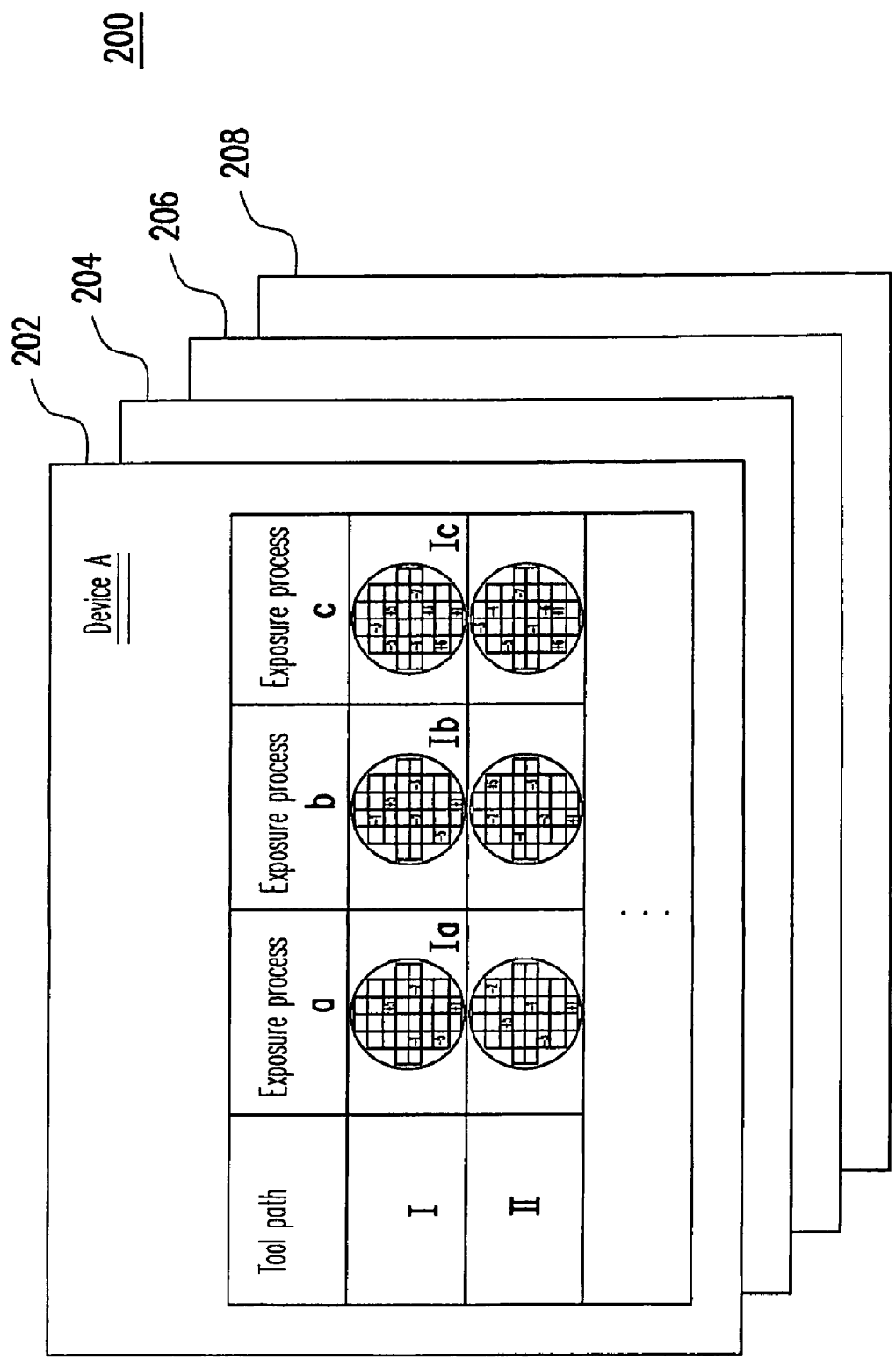
FIG. 2 is a brief schematic view of a database storing a feedback parameter map according to the present invention.

FIG. 2 is a brief schematic view of a database storing a feedback parameter map according to the present invention. Referring to FIG. 2, a database 200 has a plurality of data sheets 202, 204, 206 and 208. Taking the data sheet 202 as an example, a feedback parameter map corresponding to manufacturing a device A is recorded in the data sheet 202. A plurality of feedback parameter maps corresponding to manufacturing the device A is further classified according to the tool path of manufacturing the device A, so as to obtain feedback parameter maps Ia, Ib and Ic respectively corresponding to an exposure process a, an exposure process b and an exposure process c in a process of manufacturing the device A in the same tool path I.

Figure 3:
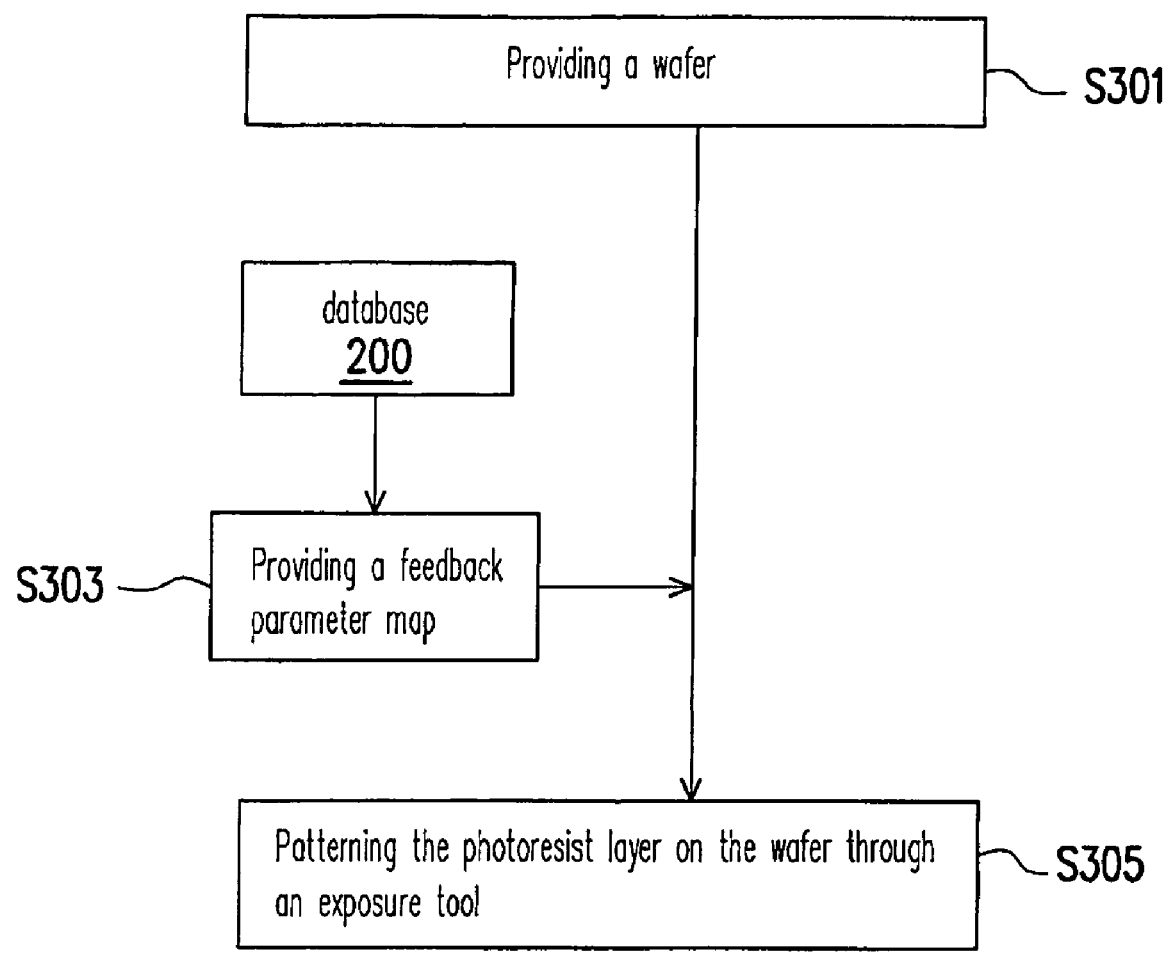
FIG. 3 illustrates a processing flow of an exposure method according to the present invention.

According to the present invention, after the database 200 is established, in the exposure process of the manufacturing procedure for forming the device, a shot-by-shot exposure parameter feedback adjustment is performed according to the corresponding feedback parameter map in the database as the exposure process is performed on each of the exposure regions of a single wafer. FIG. 3 illustrates a processing flow of an exposure method according to the present invention. Referring to FIG. 3, in step S301, a wafer is provided under the circumstance that a first tool path is selected for manufacturing a known device. The wafer is covered by a photoresist layer, and the wafer is divided into a plurality of exposure regions. After that, in step S305, a photoresist layer on the wafer is patterned by using an exposure tool. Before step S305, according to the selected first tool path and the device to be manufactured, a corresponding feedback parameter map (step S303) has to be obtained from the database 200. The features of the feedback parameter map have been described above, so the detailed description is not repeated.

Therefore, in step 305, according to a first feedback parameter map, which is corresponding to the first tool path and the particular device and is obtained from the database 200, an exposure process is performed in order on each of the exposure regions of the wafer through the exposure tool to pattern the photoresist layer. An exposure process parameter set of the exposure tool is adjusted based on the exposure-region feedback parameter set corresponding to each of the exposure regions in the first feedback parameter map while the exposure tool performs the exposure process on each of the exposure regions. Furthermore, in one embodiment, the step of performing an exposure process on each of exposure regions through an exposure tool further includes adjusting an exposure process parameter set of the exposure tool by referring to a wafer feedback parameter set fed back by an APC, so as to increase uniformity of a critical dimension of a device on wafer-to-wafer level. Moreover, the exposure process parameter set includes an exposure dose, a light incident angle, an exposure focus and an overlay offset parameter set.

According to the present invention, a device is manufactured in the pilot-run process by using the pilot-run wafer, and the database of the feedback parameter map classified according to the device and the tool path is established by using the testing information obtained from the WAT. After that, in the process for forming the device on the wafer, while the exposure process is performed on each of the exposure regions on the wafer, the exposure process parameter set of the exposure tool is adjusted according to exposure-region feedback parameter sets, which are corresponding to the exposure regions respectively, in the feedback parameter map, which is corresponding to the tool path to be used and the device to be formed, and thereby the shot-by-shot exposure parameter feedback adjustment is performed in each of the exposure regions on a single wafer according to the exposure-region feedback parameter set corresponding to the exposure region. Compared with a conventional technique in which only one feedback parameter set is fed back to each of the exposure regions on the whole wafer, the present invention can increase the uniformity of the critical dimension on the shot-to-shot level in the single wafer and the overlay alignment between the successive material layers in each exposure region is improved as well. Furthermore, while the exposure process is performed in sequence on the single wafer, the exposure process parameter set of the exposure tool is adjusted according to the feedback parameter map of the present invention, and the exposure process parameter set of the exposure tool can be further adjusted according to the wafer feedback parameter set fed back by the APC, so as to increase the uniformity of the critical dimension of the exposure regions and the uniformity of an average critical dimension of the wafers simultaneously.

Although the present invention has been described with reference to the above embodiments, it will be apparent to one of the ordinary skill in the art that modifications to the described embodiment may be made without departing from the spirit of the present invention. Accordingly, the scope of the present invention will be defined by the attached claims and not by the above detailed description.

What is claimed is:

1. An exposure method for manufacturing a device to improve an overlay alignment of successive layers in the device, the exposure method comprising:

providing a wafer, wherein the wafer is covered by a photoresist layer, and the wafer is divided into a plurality of exposure regions;

providing a feedback parameter map, wherein the feedback parameter map has a plurality of exposure-region feedback parameter sets respectively corresponding to the exposure regions of the wafer, and at least one of the exposure-region feedback parameter sets is different from the rest of the exposure-region feedback parameter sets, the feedback parameter map is obtained according to a device testing trend diagram, and the device testing trend diagram comprises a device threshold current trend diagram and a device leakage current trend diagram; and performing an exposure process sequentially on each of the exposure regions on the wafer through an exposure tool to pattern the photoresist layer according to the feedback parameter map, wherein an exposure process parameter set of the exposure tool is adjusted based on the exposure-region feedback parameter sets corresponding to each of the exposure regions in the feedback parameter map while the exposure tool performs the exposure process on each of the exposure regions.

2. The exposure method according to claim 1, wherein the device testing trend diagram is obtained by steps as follows:
providing a plurality of pilot-run wafers;
performing a pilot-run process of the device on each of the pilot-run wafers;
performing a wafer acceptable test (WAT) on each of the pilot-run wafers undergone the pilot-run process for generating a testing information corresponding to each of the pilot-run wafers; and
collecting the testing information to create the device testing trend diagram.

3. The exposure method according to claim 2, wherein the step of obtaining the feedback parameter map according to the device testing trend diagram comprises:
providing an after-etching critical dimension information and an after-develop critical dimension information corresponding to the exposure process; and
correlating the device testing trend diagram with the after-etching critical dimension information and the after-develop critical dimension information respectively to obtain the feedback parameter map.

4. The exposure method according to claim 1, wherein the step for performing the exposure process on each of the exposure regions by using the exposure tool further comprises adjusting the exposure process parameter set of the exposure tool according to a wafer feedback parameter set fed back from an advance process control (APC).

5. The exposure method according to claim 1, wherein the exposure parameter set comprises an exposure dose, a light incident angle, an exposure focus and an overlay offset parameter set.

6. An exposure method adapted for manufacturing a device through a first tool path to improve an overlay alignment of successive layers in the device, the exposure method comprising:
providing a wafer, wherein the wafer is covered by a photoresist layer, the wafer being divided into a plurality of exposure regions;

obtaining a first feedback parameter map from a database according to the first tool path, wherein the first feedback parameter map has a plurality of exposure-region feedback parameter sets respectively corresponding to the exposure regions of the wafer, at least one of the exposure-region feedback parameter sets being different from the rest of the exposure-region feedback parameter sets, the first feedback parameter map is obtained according to a device testing trend diagram, and the device testing trend diagram comprises a device threshold current trend diagram and a device leakage current trend diagram; and performing an exposure process on each of the exposure regions on the wafer through an exposure tool according to the first feedback parameter map to pattern the photoresist layer on the wafer, wherein an exposure process parameter set of the exposure tool is adjusted based on the exposure-region feedback parameter set corresponding to each of the exposure regions in the first feedback parameter map while the exposure tool performs the exposure process on each of the exposure regions.

7. The exposure method according to claim 6, wherein the database includes a plurality of data sheets, each of the data sheets being corresponding to a device manufacturing process, each of the data sheets storing a plurality of tool paths corresponding to the device manufacturing process and a plurality of feedback parameter maps respectively corresponding to the tool paths.

8. The exposure method according to claim 7, wherein the device testing trend diagram is obtained by steps as follows:
providing a plurality of pilot-run wafers;
performing a pilot-run process on each of the pilot-run wafers through a tool path;
performing a WAT on each of the pilot-run wafers undergone the pilot-run process for generating a testing information corresponding to each of the pilot-run wafers; and
collecting the testing information to create the device testing trend diagram.

9. The exposure method according to claim 8, wherein the step of obtaining the first feedback parameter map according to the device testing trend diagram comprises:
providing an after-etching critical dimension information and an after-develop critical dimension information corresponding to the exposure process; and
correlating the device testing trend diagram with the after-etching critical dimension information and the after-develop critical dimension information respectively to obtain the first feedback parameter map.

10. The exposure method according to claim 6, wherein the step for performing the exposure process on each of the exposure regions by using the exposure tool further comprises adjusting the exposure process parameter set of the exposure tool according to a wafer feedback parameter set fed back from an advance process control (APC).

11. The exposure method according to claim 6, wherein the exposure parameter set comprises an exposure dose, a light incident angle, an exposure focus and an overlay offset parameter set.

* * * * *